US006831338B1

(12) United States Patent
Roy

(10) Patent No.: US 6,831,338 B1
(45) Date of Patent: Dec. 14, 2004

(54) POWER COMPONENT BEARING INTERCONNECTIONS

(75) Inventor: Mathieu Roy, Joue les Tours (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/420,478

(22) Filed: Oct. 19, 1999

(30) Foreign Application Priority Data

Oct. 19, 1998 (FR) ............................................. 98 13219

(51) Int. Cl.$^7$ ............................................ H01L 31/119
(52) U.S. Cl. ....................... 257/409; 257/500; 257/501; 257/502
(58) Field of Search ................................ 257/409, 410, 257/500, 501, 502, 503

(56) References Cited

U.S. PATENT DOCUMENTS

| | | |
|---|---|---|
| 3,414,780 A | 12/1968 | Diebold |
| 3,559,006 A | 1/1971 | Otsuka |
| 3,821,782 A | 6/1974 | Hutson |
| 4,298,881 A | 11/1981 | Sakurada et al. |
| 5,109,266 A | 4/1992 | Kida et al. ..................... 357/53 |
| 5,430,324 A | 7/1995 | Bencuya |
| 5,434,445 A | 7/1995 | Ravanelli et al. ............ 257/488 |
| 5,496,761 A | 3/1996 | Ravanelli et al. ............. 437/60 |
| 5,506,425 A | 4/1996 | Whitney et al. |
| 5,605,852 A | 2/1997 | Bencuya |
| 5,750,414 A | 5/1998 | Whitney |
| 5,793,063 A | 8/1998 | Whitney |
| 5,804,868 A | 9/1998 | Kobayashi et al. ......... 257/630 |
| 5,864,167 A | 1/1999 | Cutter |
| 6,023,078 A | 2/2000 | Baliga |

FOREIGN PATENT DOCUMENTS

| | | | |
|---|---|---|---|
| JP | 3 56 158474 | 12/1981 | |
| JP | 3 60 229371 | 11/1985 | |
| WO | WO 95/04374 | 2/1995 | ........... H01L/29/06 |

OTHER PUBLICATIONS

French Search Report from application No. 98 13219.
French Search Report from application No. 98 13542, filed Oct. 23, 1998.
Patent Abstracts of Japan, vol. 014, No. 082 (E–0889), Feb. 15, 1990 & JP 01 293661 A, Nov. 27, 1989 (inventor Matsuura Tsutomu).
Elmar Falck, et al., Influence of Interconnections onto the Breakdown Voltage of Planar High–Voltage p–n Junctions. IEEE Transactions on Electron Devices, vol. 40, No. 2, Feb. 1, 1993, pp 439–447, XP000335349.
U.S. patent application No. 09/420,478, filed Oct. 19, 1999 entitled Power Component Bearing Interconnections, by Mathieu Roy.
Patent abstracts of Japan, vol. 007, No. 045 (E–160), Feb. 23, 1983, & JP 57 196570 A Dec. 2, 1982 (inventor Uchida Shotaro).

*Primary Examiner*—Long Pham
*Assistant Examiner*—Nathan W. Ha
(74) *Attorney, Agent, or Firm*—Lisa K. Jorgenson; James H. Morris; Wolf, Greenfield & Sacks, P.C.

(57) ABSTRACT

A power component formed in an N-type silicon substrate delimited by a P-type wall, having a lower surface including a first P-type region connected to the wall, and an upper surface including a second P-type region, a conductive layer extending above the substrate between the second region and the wall. The component includes a third N-type region of high doping level formed in the substrate under the portion of the layer substantially halfway between the external periphery of the second region and the internal periphery of the wall. This third region is contacted by a field plate extending on either side of the third region in the direction of the wall and of the third region.

4 Claims, 2 Drawing Sheets

POWER COMPONENT BEARING INTERCONNECTIONS

BACKGROUND OF THE INVENTION

1. Field of the Invention

The present invention relates to vertical power components, and more specifically to an optimization of the breakdown voltage of power components having interconnections on their upper surface.

2. Discussion of the Related Art

FIG. 1 very schematically shows a partial cross-sectional view of a portion of a high voltage power component in a border region thereof. The component, only a portion of which is illustrated, is formed in a lightly-doped silicon substrate 1. In the following description, it will be assumed that this substrate is of type N but, of course, all conductivity types could be inverted. The component is delimited at its periphery by an insulating wall 2, which extends from the upper surface to the lower surface of the substrate. The insulating wall can correspond to the limit of the semiconductive chip in which the component 1 is formed. It can also correspond, within a semiconductive chip, to a separation between two neighboring components. Of course, the present invention also applies to components of silicon-on-insulator (SOI) type.

In a current configuration of high voltage vertical semiconductor components, a P-type layer 3 is formed, continuously or not, on the lower surface of the substrate and extends to reach the insulating wall. On the upper surface side of the substrate, a layer 4, also of type P, is arranged. P-type layer 4, N-type substrate 1, and P-type layer 3 are layers constitutive of a high voltage vertical component, the high voltage being withstandable especially due to the large thickness and to the small doping level of substrate 1. The PNP layers 4-1-3 altogether can for example form a transistor.

A rear surface metallization M1 is in contact with the entire rear surface of the component and a metallization M2 is linked, directly or indirectly, to layer 4. This link is indirect in the case where a PNP transistor is desired to be formed In the case shown where a thyristor with or without a gate is desired to be formed, an additional heavily-doped N-type layer 5 is made to form the thyristor cathode in contact with metallization M2. The periphery of layer 4 is spaced apart from insulating wall 2 by a portion of substrate 1 and further includes, preferably, a lightly-doped P-type (P$^-$) area 6 deeper than region 4.

When a positive voltage is applied between metallizations M1 and M2, the blocking junction is the junction between substrate 1 and P region 4-6. Around this junction, the breakdown voltage mainly results from a so-called space charge area delimited by equipotential surfaces E1L and E1H, shown in dotted lines in the drawing. Equipotential surface E1L indicates the area at the low potential of electrode M2, for example, 0 volt. Equipotential E1H designates the area at the high potential of electrode M1, for example, 600 volts.

When the device is reverse-biased, that is, metallization M2 is positively biased with respect to metallization M1, the breakdown voltage is essentially ensured by the junction between substrate 1 and, on the one hand, P layer 3, on the other hand, insulating wall 2. E2L and E2H have been used to designate the limits of the space charge area, that is, the equipotential surfaces at the low potential and at the high potential, respectively. For a device to have a high breakdown voltage, the extreme equipotential surfaces have to be as distant as possible to avoid reaching the breakdown potential in the semiconductor (on the order of 20 V/$\mu$m). Thus, one of the layers in the vicinity of the junction which ensures the breakdown voltage should be relatively lightly doped so that the space charge area can extend rather widely therein.

Independently from the need to ensure a sufficient breakdown voltage of the component when high potentials are applied thereacross, leakage current problems also arise. For various reasons, for example, due to pollution of the oxides, it is possible for N substrate 1 to be strongly depleted at its surface under an upper insulating layer 8. An inversion of the population in this region may even be achieved. A channel region ensuring an electric continuity between the external periphery of P region 6 and the internal periphery of insulating wall 2 then appears. To avoid such leakage currents, it is known to use a so-called stop-channel region formed of a heavily-doped N-type (N$^+$) area 10 at the surface of substrate 1 between the external periphery of region 6 and the internal periphery of wall 2. Although this does not appear in cross-section, area 10 actually forms a ring which extends over the entire periphery of the involved component. Given its high doping level, N$^+$ ring 10 is not likely to be inverted and thus interrupts any inversion channel likely to form at the component surface. To enhance the equipotentiality of stop-channel ring 10 and avoid the occurrence of a localized depletion, it is conventional to coat this diffused ring 10 with a metallization (not shown).

FIG. 2A illustrates what can be the effect on the equipotential distribution of a conductive track running over the upper surface of the component. In the example shown, metallization M2 is prolonged by a metal track L intended, for example, for ensuring a connection between metallization M2 and a metallization of another component arranged in the same substrate 1 to the right of insulating wall 2. It should be underlined, given that this is not apparent in the cross-sectional view of FIG. 2A, that metallization L corresponds to a relatively thin metal track as compared to the surface occupied by a contact metallization such as metallization M2. In power components, the metal track can have a width on the order of 10 to 100 $\mu$m. The way in which equipotential surfaces E1L and E1H on the one hand, and equipotential surfaces E2L and E2H on the other hand deform, when the component is biased, respectively forward and in reverse, has been shown in FIG. 2A.

In the case where the component is forward biased, equipotential surface E1L is practically not deformed while equipotential surface E1H runs along the mechanical track in the direction of insulating wall 2. When it reaches said insulating wall, a punch-through occurs. This means that the component turns on, while it would be desired for it to be able to withstand the voltage while remaining off. This punch-through is not destructive but causes a premature start of a component which would be desired to remain off.

In a reverse biasing, essentially equipotential surface E2L deforms, at the level of the upper component portion. Then, the space charge area reduces and the field at the level of the upper portion of the junction between substrate 1 and wall 2 strongly increases. A breakdown of the junction can occur, which can cause a destruction thereof.

FIG. 2B shows an alternative of FIG. 2A in the case of the presence of a stop-channel region 10. In a forward biasing, equipotential surface E1 tend to deform as indicated in relation with FIG. 2A. However, the high equipotential surfaces (E1H) and the intermediary equipotential surfaces will come closer to one another in stop-channel region 10 and there is a high risk for a breakdown to occur in this area. It can thus be seen that the presence of a stop-channel region, which avoids leakage currents, is prejudicial to the breakdown voltage in the considered case.

The problem discussed hereabove, which is raised when a connection track runs over a high voltage component, is known in the art and various solutions have been provided to solve it.

An obvious solution consists of increasing the thickness of insulating layer 8 above which conductive track L runs, to reduce the influence on the semiconductor of the field created by this track. However, this solution rapidly comes up against practical limits. Indeed, it is difficult to deposit a high-quality insulator of a thickness greater than 6 $\mu$m which, for oxide, results in the best case in a breakdown voltage on the order of 600 V.

Other solutions used for voltages greater than 600 V are illustrated in FIG. 3. FIG. 3 illustrates several solutions which are usually alternately used.

A first solution consists of adding a lightly-doped P-type region 11, extending along the internal periphery of insulating wall 2 and in contact with this insulating wall. This improves the reverse breakdown voltage (junction between substrate 1 and insulating wall 2).

The other solutions consist of providing field plates.

According to a second solution, floating field plates 13 are arranged above insulating layer 8, perpendicularly to the track from which they are separated by an insulating layer 14. Then, if floating plates 13 clearly transversally extend beyond the track, they are not likely to be capacitively charged by said track and are capacitively coupled with the silicon. They then take charge of the equipotential surfaces by drawing them into the oxide area. However, this solution, based on the capacitor principle, strongly depends on the quality of the oxides and on their possible contaminations. Further, it can require the use of submicronic lithography equipment, which is not necessarily available in power component manufacturing technologies.

According to a third solution, a field plate 15 in contact with insulating wall 2, extending inwards with respect to this insulating wall, is used. This type of structure solves the problem of cathode breakdown voltage since the equipotential surfaces are taken in charge between the field plate and the track before reaching the anode junction. However, this implies an extension of the field plate beyond the well, which adversely affects the breakdown voltage thereof. On the other hand, if the anode is grounded, the substrate is at the high voltage and the track is close to 0 volt (case of a substrate biased by the forward junction, the latter being connected to the cathode via a diffused resistor), the cathode and the anode then are simultaneously blocked and this solution does not work.

Thus, prior art solutions have the disadvantage, either of requiring technologies of complex implementation, or of being efficient only for a specific biasing of the track with respect to the other elements, or of requiring an increase of the silicon surface used.

SUMMARY OF THE INVENTION

The present invention aims at solving the problem raised by the breakdown voltage of a power component in the presence of an interconnection track while avoiding one or several of the disadvantages of prior art structures.

To achieve these and other objects, the present invention provides a high voltage component formed in a region of a silicon substrate of a first conductivity type delimited by a wall of the second conductivity type, having a lower surface including a first region of the second conductivity type connected to the wall, and an upper surface including at least a second region of the second conductivity type, a high voltage being likely to exist between the first and second regions and having to be withstood on the upper surface side by the junction between the second region and the substrate or by the junction between the wall and the substrate, a conductive track being likely to be at a high potential extending above the substrate between the second region and the wall. This component includes a third region of the first conductivity type of high doping level formed in the substrate under a portion of the track substantially halfway between the external periphery of the second region and the internal periphery of the wall, this third region being contacted by a field plate insulated from the track, extending widthwise at least substantially across the track width, and lengthwise on either side of the third region in the direction of the wall and of the second region.

According to an embodiment of the present invention, the field plate extends beyond the third region in the wall direction and in the direction of the second region over a distance greater than 10 $\mu$m.

According to an embodiment of the present invention, the external periphery of the second region comprises a ring of the same conductivity type of low doping level.

The foregoing objects, features and advantages of the present invention will be discussed in detail in the following non-limiting description of specific embodiments in connection with the accompanying drawings.

DETAILED DESCRIPTION

In the various drawings, as conventional in the field of the representation of semiconductor components, the various dimensions are not drawn to scale, and have been arbitrarily drawn to ease the readability of the drawings and improve their intelligibility. Those skilled in the art will known how to adapt the various thicknesses and doping levels according to usual rules of semiconductor power component manufacturing.

Figure 1:
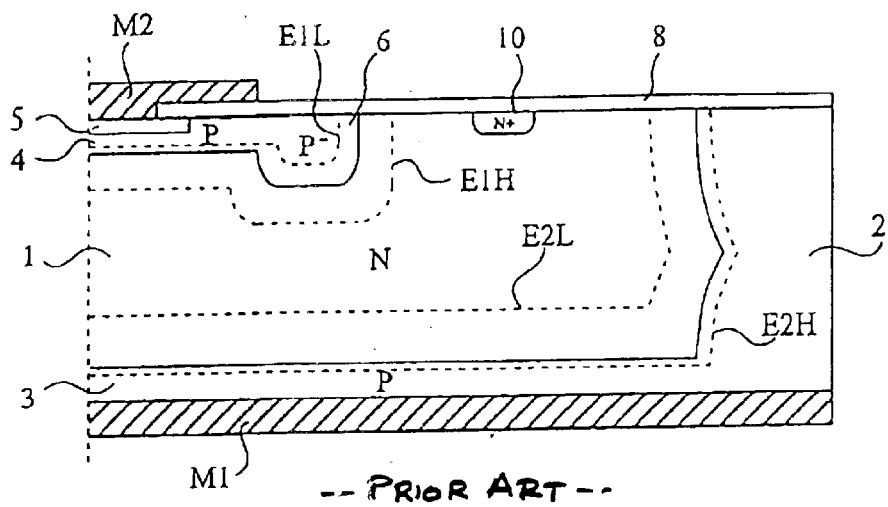
FIGS. 1, 2A, 2B, and 3 are simplified cross-sectional views of a limiting area of a high voltage component according to prior art.
Figure 2A:
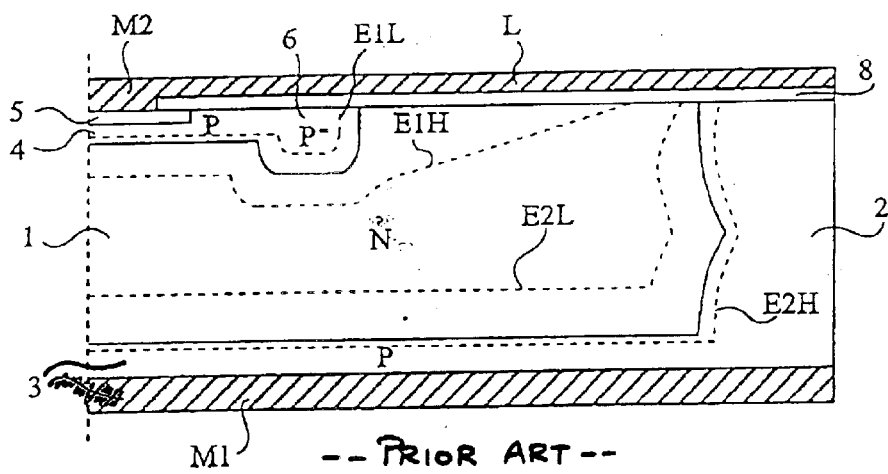
Figure 2B:
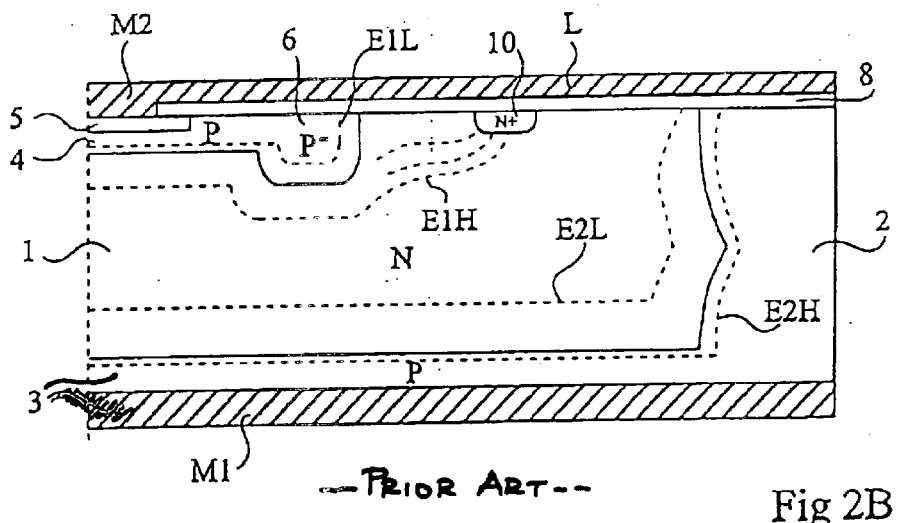
Figure 3:
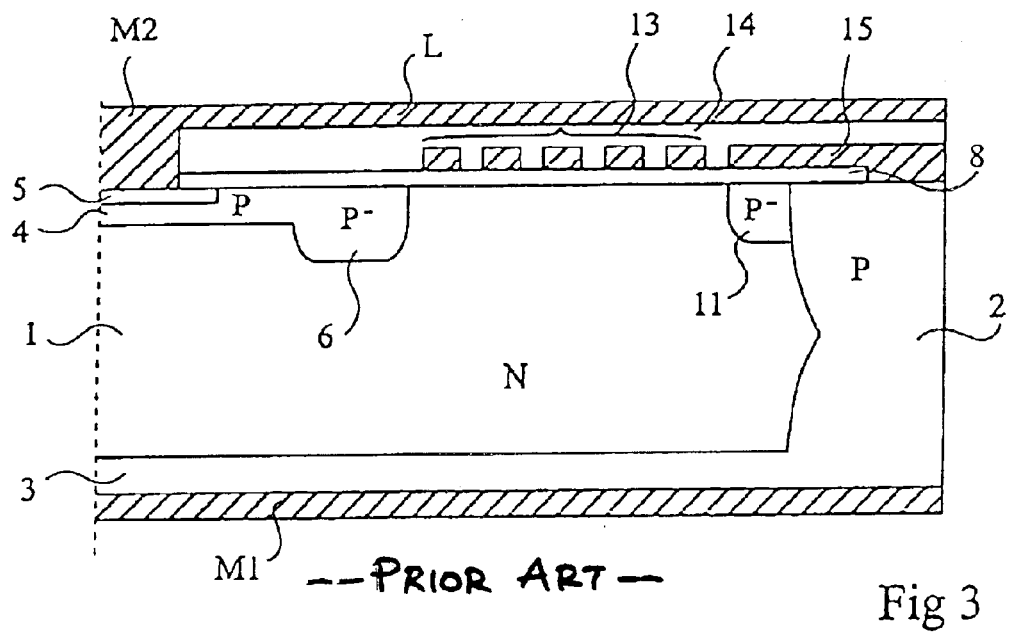
Figure 4:
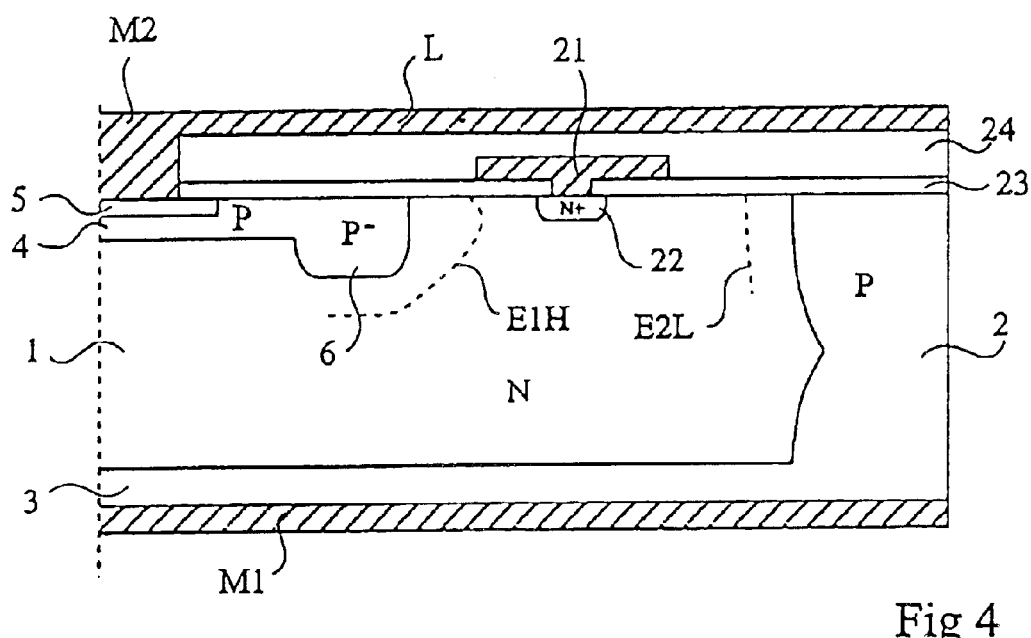
FIG. 4 is a simplified cross-sectional view of a limiting area of a high voltage component according to the present invention.

FIG. 4 shows the same border region of a high voltage component as that shown in FIG. 1.

According to the present invention, a field plate 21 arranged above substrate 1 between the external periphery of the P-type junction (6-1) which withstands the forward voltage and the internal periphery of the insulating wall which withstands the reverse voltage, is provided. Field plate 21 is formed on an insulating layer 23 and is separated from metallization M2 by an insulating layer 24. This field plate extends between the external periphery of region 6 and the internal periphery of insulating wall 2 substantially to reach the normal extension of the space charge area (E1H, E2L) which would occur for the desired breakdown voltage in the absence of track L. Field plate 21 is in contact, substantially in its central portion in the longitudinal direction, with substrate 1 via a more heavily-doped N⁺-type contacting region 22. Although this does not appear in the cross-sectional view, it should be noted that contact region 22 substantially has the width of track L and does not form a peripheral ring as in the case of stop-channel ring 10 described in relation with FIG. 1. The field plate has a width preferably slightly greater than that of the track.

There appears that with such a field plate, the equipotential distribution is little deformed as compared to what it is in the absence of track L. When the component is off, equipotential surface E1H, which tends, as described previously, to run along track L, cannot reach contact region 22, but rises to the upper insulator layer which ensures a high breakdown voltage between the field plate and track L before reaching any junction, thus avoiding a premature punch-through or breakdown. It should be noted that this solution is also efficient when the metal track is connected to the anode as well as when both junctions are simultaneously blocked.

Field plate 21 can be made of any conductive material usual in the field of semiconductor component manufacturing: doped polysilicon, metal silicide, metal, metal alloy.

Designating by E1 (in $\mu$m) the thickness of oxide layer 23 under the field plate, by E2 (in $\mu$m) the thickness of oxide layer 24 formed above the field plate and by d (in $\mu$m) the lateral extension of the field plate beyond region 22, the results illustrated by table I have been obtained for breakdown voltage $V_{BR}$ (in volts).

| E1 | E2 | d | $V_{BR}$ |
|---|---|---|---|
| 2.7 | 3 | 2 | 470 |
| 2.7 | 3 | 14 | 670 |
| 2.7 | 3 | 30 | 680 |
| 2.7 | 3 | 50 | 680 |

It can be seen that, as soon as extension d reaches a sufficient value, greater than 10 $\mu$m in the considered example, the breakdown voltage is clearly increased and varies from less than 500 V to almost 700 V. Of course, this breakdown voltage increases if the insulator thicknesses increase.

The field plate according to the present invention may extend, as indicated hereabove, only substantially across the track width. In the case where there is a peripheral stop-channel region, it may extend over the entire periphery of this stop-channel region.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A high voltage device formed in a region of a silicon substrate of a first conductivity type delimited by a wall of a second conductivity type, comprising:

a lower surface comprising a first region of the second conductivity type connected to the wall, an upper surface comprising a second region of the second conductivity type, a high voltage being likely to exist between the first and second regions and having to be withstood on the upper surface side by a junction between the second region and the substrate or by a junction between the wall and the substrate, a conductive track being likely to be at a high potential extending over the substrate between the second region and the wall, and a third region of the first conductivity type of a high doping level formed in the substrate under a portion of the track substantially halfway between the second region and the internal periphery of the wall, the third region being contacted by a field plate which is insulated from the track, and extends widthwise at least substantially across the track and lengthwise beyond the third region on either side of the third region in the direction of the wall and of the second region.

2. The device of claim 1, wherein the field plate extends beyond the third region in the wall direction and in the direction of the second region over a distance greater than 10 $\mu$m.

3. The device of claim 1, wherein the external periphery of the second region comprises a ring of the same conductivity type as the second region, but having a lower doping level than the second region.

4. A high voltage device formed in a region of a silicon substrate of a first conductivity type delimited by a wall of a second conductivity type, comprising:

a lower surface comprising a first region of the second conductivity type connected to the wall;

an upper surface comprising a second region of the second conductivity type;

a conductive track extending over the silicon substrate between the second region and the wall;

a third region of the first conductivity type having a high doping level formed in the substrate under a portion of the conductive track approximately halfway between the second region and an internal periphery of the wall; and a field plate which is insulated from the track and extends widthwise at least substantially across the track and lengthwise on either side of the third region, beyond the third region, in the direction of the wall and of the second region, at least a portion of the field plate being in contact with the third region.

* * * * *